United States Patent
An et al.

(10) Patent No.: US 10,477,719 B1
(45) Date of Patent: Nov. 12, 2019

(54) SECURABLE CABLE ACCESS

(71) Applicant: ZT Group Int'l, Inc., Secaucus, NJ (US)

(72) Inventors: Chen An, Bergenfield, NJ (US); Mahesh Kumar Varrey, Rutherford, NJ (US); Zichun Song, Bergenfield, NJ (US); Jay Dilipkumar Pathak, Lawrence Township, NJ (US)

(73) Assignee: ZT Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 16/159,353

(22) Filed: Oct. 12, 2018

(51) Int. Cl.
*H05K 7/14* (2006.01)
*H05K 5/03* (2006.01)
*H05K 5/02* (2006.01)

(52) U.S. Cl.
CPC ......... *H05K 7/1491* (2013.01); *H05K 5/0239* (2013.01); *H05K 5/03* (2013.01); *H05K 7/1487* (2013.01); *H05K 7/1489* (2013.01)

(58) Field of Classification Search
None
See application file for complete search history.

(56) References Cited

U.S. PATENT DOCUMENTS

| | | | | |
|---|---|---|---|---|
| 2006/0030223 A1* | 2/2006 | Campbell | ............ | H01R 4/2408 439/810 |
| 2008/0111032 A1* | 5/2008 | Yang | ............... | H05K 7/1491 248/68.1 |
| 2012/0126069 A1* | 5/2012 | Kucer | ................. | H05K 7/1425 248/67.5 |
| 2012/0138725 A1* | 6/2012 | Chen | ................. | B65H 75/4428 242/378.1 |
| 2013/0163168 A1* | 6/2013 | Liang | .................. | H05K 7/1491 361/679.02 |
| 2013/0321997 A1* | 12/2013 | Yi | ........................... | G06F 1/183 361/679.02 |
| 2014/0049144 A1* | 2/2014 | Han | ..................... | H05K 5/0247 312/223.6 |
| 2016/0095239 A1* | 3/2016 | Kawamata | .......... | H05K 5/0247 361/807 |
| 2016/0360637 A1* | 12/2016 | Harvilchuck | ....... | H05K 7/1491 |
| 2018/0020569 A1* | 1/2018 | Wang | ................... | H04Q 1/062 |

* cited by examiner

*Primary Examiner* — Binh B Tran
*Assistant Examiner* — Douglas R Burtner
(74) *Attorney, Agent, or Firm* — Dergosits & Noah LLP; Todd A. Noah

(57) ABSTRACT

An apparatus for securing a cable access includes a first cable opening in a top plate of a server rack with a tray affixed to the interior side of the top plate and with a second cable opening that overlaps the first cable opening. A hatch element is movable in a space between the plate and tray to cover up the unneeded areas of the first and second cable openings after cables have been installed. A ratchet and pawl attached to the tray and hatch element cooperate to allow movement of the hatch element in a closing direction and resist movement of the hatch element in an opening direction, with a release element disengaging the ratchet and pawl to allow the hatch element to open.

21 Claims, 8 Drawing Sheets

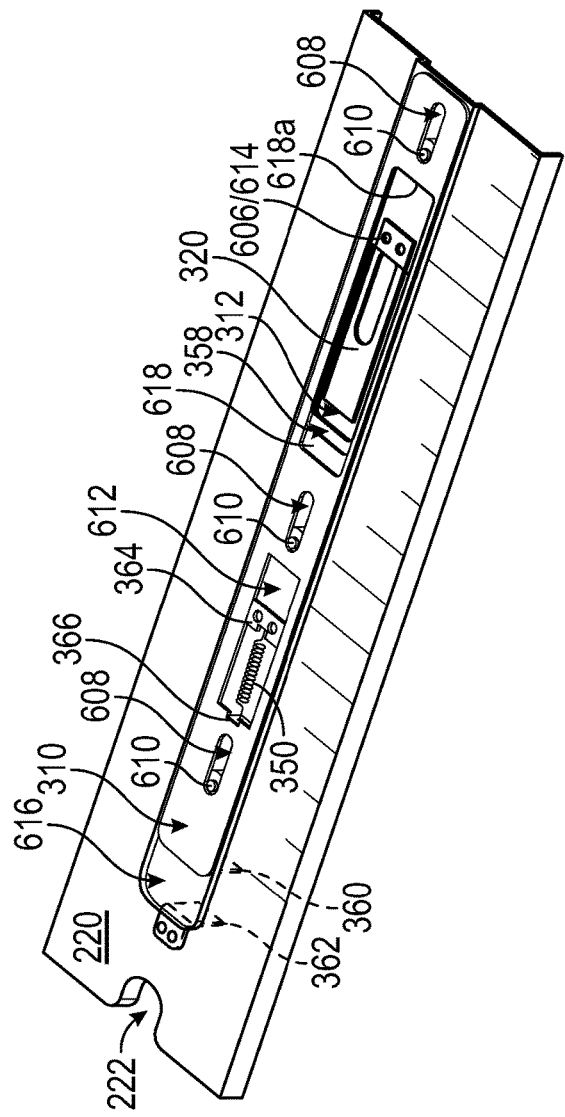
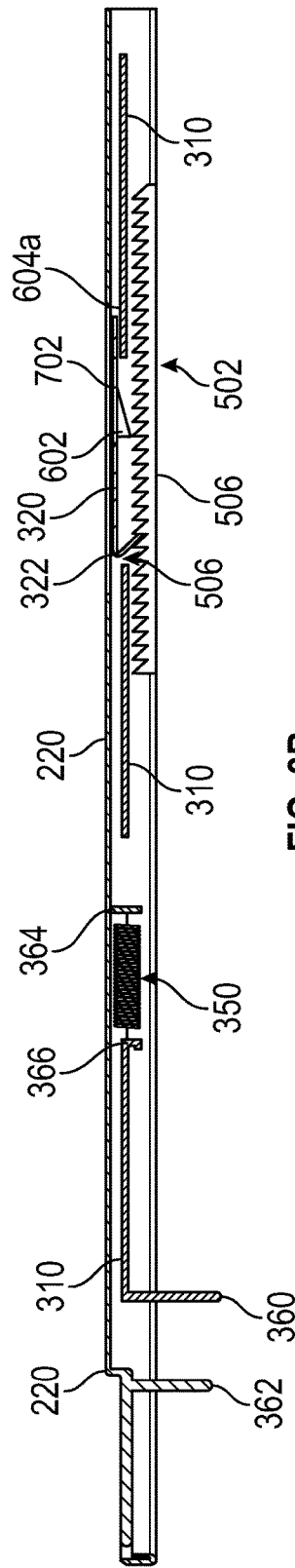
FIG. 8A
FIG. 8B

ёRABLE CABLE ACCESS

SECURABLE CABLE ACCESS

BACKGROUND

Typical methods for passing cables and their connectors through enclosures to the electronic devices within suffice to provide access but do so without providing security. That is, typical cable accesses allow cables to pass through racks (e.g., a server rack) to devices within, but do not incorporate a method to securely cover the open gaps that remain in the rack surface after the cables have been installed. In some solutions that do provide security, the cables may be permanently affixed to the enclosed rack, or a female plug may be mounted to the outer surface, which would function as an extension adapter allowing connection to the electronic device inside.

FIGS. 1A-1C are perspective views of exemplary prior art server racks 110, 120 with prior art cable accesses. FIG. 1A depicts a server rack 110 with cable accesses in the top panel that have brushes through which cables and connectors may be passed. The brushes work to exclude foreign elements, such as dust and other debris, but are otherwise insecure. Rack 110 may be found at www.martinenclosures.com. FIGS. 1B and 1C depict server rack 120 with cable accesses sealed 122, 124, and then open 132, 134. When sealed, accesses 122, 124 provide security but do not provide for cables to pass through. When unsealed, cable accesses 132, 134 admit cables, but are not secure. Rack 120 may be found at www.rackmountmart.com.

In addition, in both rack 110 and 120, cables may be inadvertently unplugged from the electronic devices within when tension is applied to a cable or the cable is jostled, particularly if the connection is otherwise loose.

Thus, there exists a need for a secure-able cable access and cable retention mechanism.

BRIEF DESCRIPTION OF THE DRAWINGS

The embodiments are illustrated by way of example and not limitation in the figures of the accompanying drawings, in which like references indicate similar elements, and in which:

FIG. 8A is a top perspective of a partial assembly of the embodiment of FIG. 3 in a "ratchet-engaged" state;

FIG. 8B is a side view of the partial assembly of FIG. 8A;

DETAILED DESCRIPTION

Embodiments described within provide a secure-able cable access. The embodiments enable a user to pass a certain number of cables into an opening in an enclosure and then extend a hatch that both "herds" the cables into a relatively small section of the opening and covers the remaining section of the opening. The enclosure may include but is not limited to a server rack. In an embodiment, the hatch is only retractable from within the enclosure. In an embodiment, once the cables are installed, a hatch may be extended toward the cables and the cables forced into a smaller section of the opening. As this hatch is extended, a ratcheting mechanism engages and this resists movement of the hatch in the return, retracting direction. The hatch may be moved forward to the point that it becomes snug against the cables, which prevents further forward motion. At this point, the initial opening in the enclosure is now occupied by the cables or covered by the hatch. Furthermore, in the embodiment, the ratcheting mechanism cannot be released from the outside of the enclosure. Thus, the hatch cannot be opened from outside the enclosure and the enclosure is secure (at least with regard to that particular opening). Furthermore, with the cables having been forced into a smaller area and with the hatch snugged up against the cables, the cables are more securely retained—having less freedom to move as a result of jostling or tension—and are less likely to come unplugged. In embodiments, the ratcheting mechanism may be released from within the enclosure, allowing the cables to be changed or serviced in some manner.

Figure 1A:
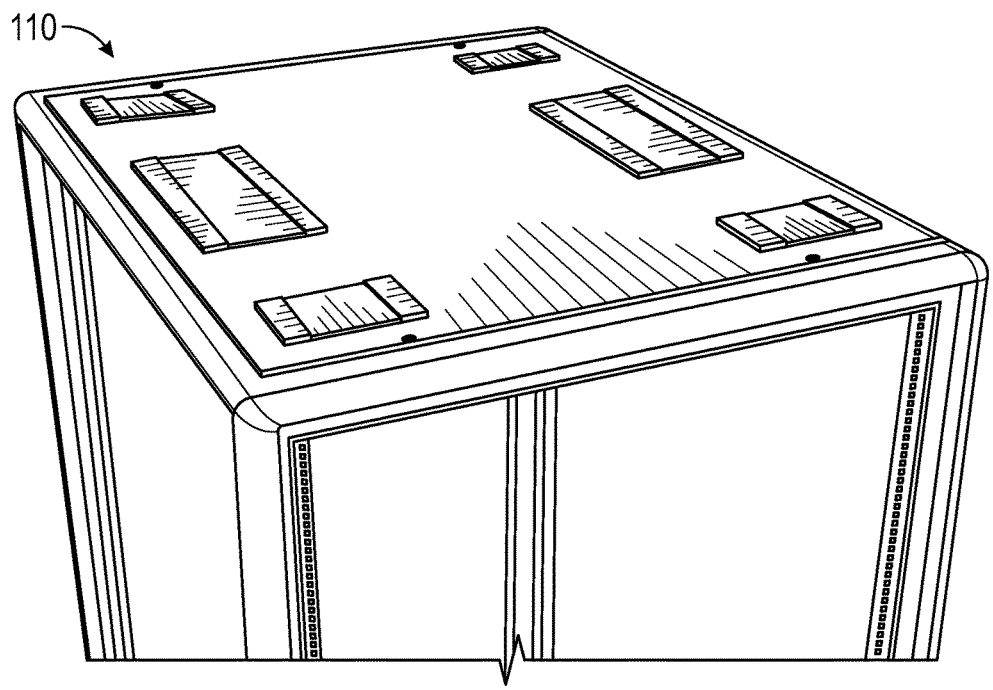
FIGS. 1A-1C contains perspective views of prior art server racks with prior art cable accesses.
Figure 1B:
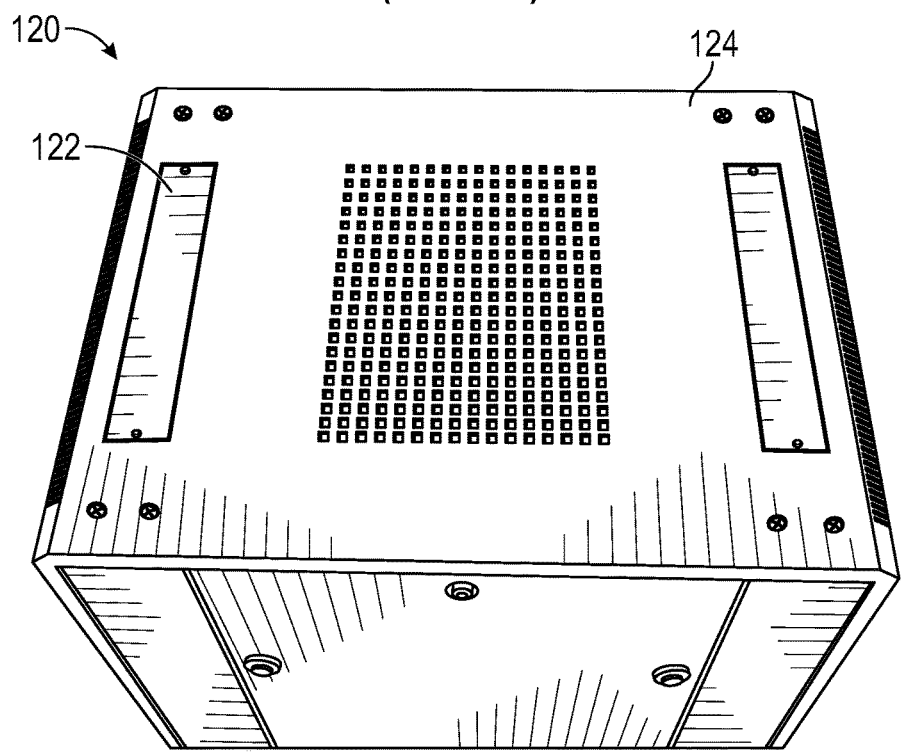
Figure 1C:
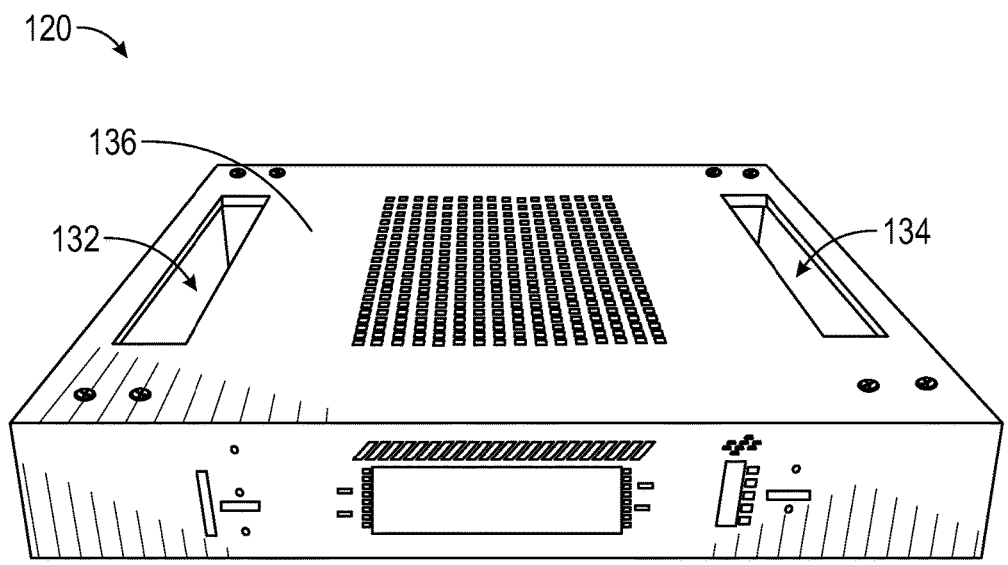
Figure 2:
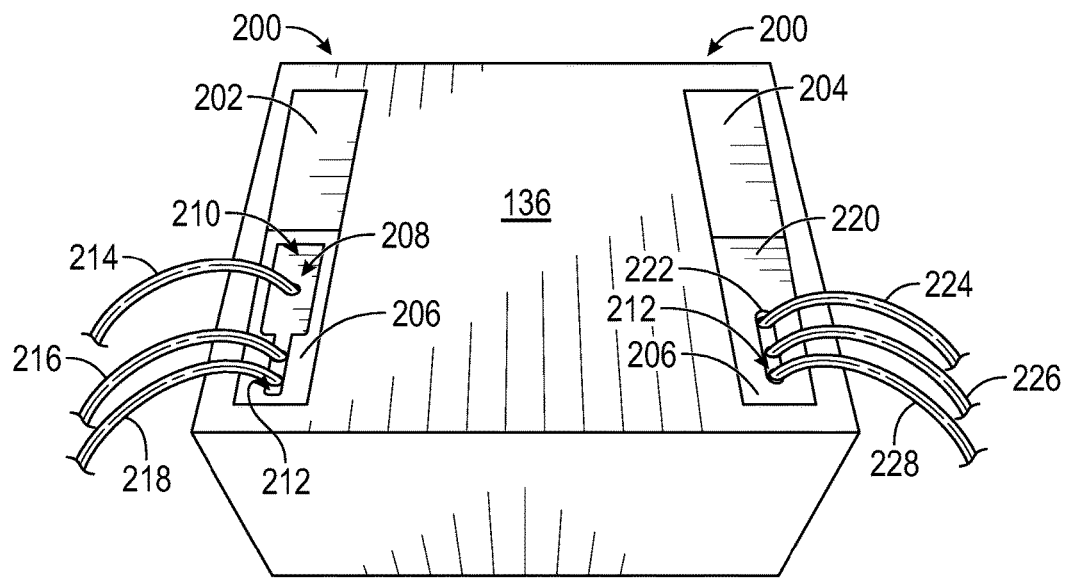
FIG. 2 is a top perspective view of an embodiment of a secure-able cable access.

FIG. 2 is a top perspective view of an embodiment of a secure-able cable access 200. In FIG. 2, access openings 132, 134 of rack top 136 (FIG. 1C) have been fitted with an embodiment of a secure-able cable access 200, with partial panels 202, 204 covering approximately half of access openings 132, 134. On the left side of FIG. 2, secure-able cable access 200 is in an open state allowing cable and connector access through opening 208. A bottom tray 206 can be seen through the uncovered section of the access opening. In bottom tray 206, an opening 208 is provided that has a wide section 210 of relatively larger area and a narrow section (or "slot") 212 that is only marginally wider than an individual cable. As shown, the section of access opening 132 that is not covered by partial panel 202 "overlaps" opening 208 (See FIG. 3 regarding this overlap). In the open state, secure-able cable access 200 allows access to the interior of the enclosure (i.e., wide section 210 is large enough to admit cable connectors for cables 214, 216, 218). Both partial panel 202 and bottom tray 206 are fixed in place. In the embodiment of FIG. 2, partial panels 202, 204 and bottom trays 206 are bolted to rack top 136 from the interior of the enclosure (i.e., from below), but in other embodiments partial panels 202, 204 and bottom trays 206 may be attached from above and by other means (e.g., by welding).

On the right side of FIG. 2, cable access 200 is being moved to a closed state, which prevents access to the interior of the enclosure and which also snuggly retains cables 224, 226, 228. On the right side of FIG. 2, the access opening 134 has been partially covered by a partial panel 204. A hatch (or "slider housing") 220 further overlaps access opening 134 and also wide section 210 of opening 208. The edge of hatch 220 nearest cables 224, 226, 228 is provided with a notch 222 that is dimensioned to match the width of slot 212. A second bottom tray 206 can be seen through the uncovered section of the access opening. In the embodiment, when retracted as in the left side of FIG. 2, hatch 220 is positioned below partial panel2 202, 204. From that retracted position, hatch 220 may be slid to an extended position. The extension of hatch 220 may be halted either by coming into contact with and being stopped by one or more cables (e.g., cables 224, 226, 228), or hatch 220 may be halted by the edge of the access opening. As seen on the right side of FIG. 2, hatch 220 has been extended so that wide section 210 of opening 208 has been covered, but hatch 220 has not yet been hindered by cables 224, 226, 228. Thus, hatch 220 may still be slid forward until notch 222 contacts cables 224, 226, 228 and cables 224, 226, 228 are forced further against the end of slot 212. At that point, cables 224, 226, 228 will be snuggly retained between slot 212 and notch 222. Also at that point, hatch 220 is prevented from retracting by a ratcheting mechanism to be discussed with respect to FIGS. 3-9B. Thus, secure-able cable access 200 allows cables to be connected to devices within the enclosure and then hatch 220 may be extended to prevent both further access to the interior of the enclosure and the jostling or removal of the cables.

In an embodiment, opening 208 may be rectangular (e.g., with a width that is uniformly as "wide" as section 210) and hatch 220 may extend until all cables are held between the end of hatch 220 and the wide end of opening 208. In other words, in this embodiment, when the hatch is extended, cables are not forced into slot, but are forced against a wide end of the opening.

Figure 3:
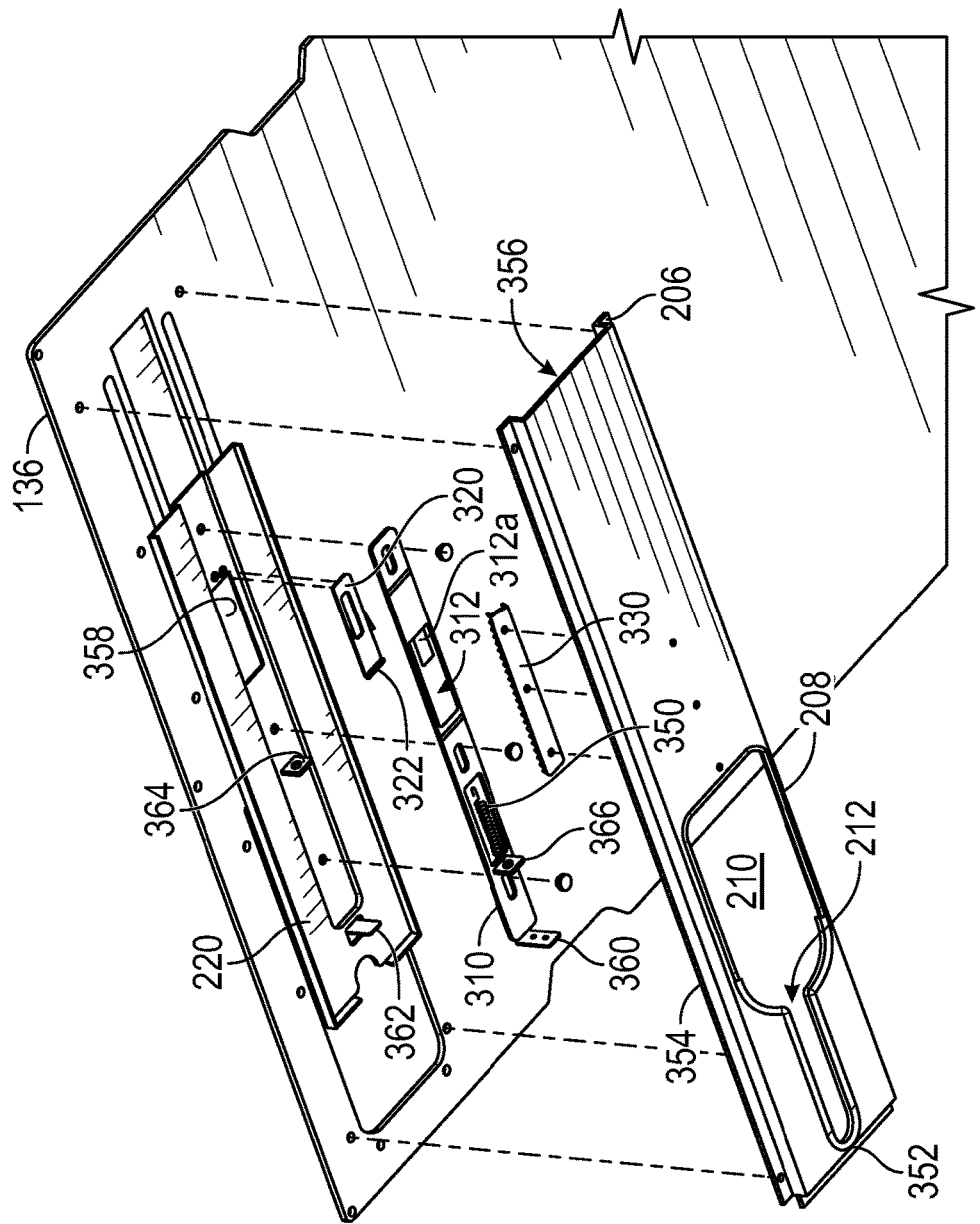
FIG. 3 is perspective drawing depicting a disassembled embodiment of a secure-able cable access.

FIG. 3 is perspective drawing depicting a disassembled embodiment of a secure-able cable access 200. As shown with regard to FIG. 2, secure-able cable access 200 is dimensioned to admit cables and connectors to the interior of the enclosure through both access opening 134 and wide section 210. Secure-able cable access 200 then employs a linear ratchet and pawl mechanism to cause hatch 220 to securely reduce that unnecessary open area after the connections have been made. The linear ratchet and pawl mechanism includes a pawl 320, a linear ratchet 330, a tension spring 350, a slider handle 360, a hatch handle 362, and hatch 220. One will understand that these parts may be fashioned from various materials and in various dimensions depending, e.g., on the level of security or service life desired.

After a user passes cable connections through wide section 210, using handle 362 from within the enclosure the user may slide hatch 220 towards the bundle of cables, eliminating excess gap. In this manner the cables may be locked into position within slot 212. In the embodiment of FIG. 3, to remove any cable a user must have access to the interior of the enclosed unit in order to open the secure-able cable access—in other words, in the embodiment, hatch 220 may only be retracted from within the enclosure. In order to open secure-able cable access 200, slider handle 360 is urged toward hatch handle 362. This causes relative movement between slider 310 and hatch 220, which in turn raises pawl hook 322, forcing it to disengage from ratchet 330.

The embodiment depicted in FIG. 3 is thought to be suitable for current U.S. (15 mm diameter) and European (12 mm diameter) versions of power whips and fiber optic cables. In an embodiment, slot 212 is dimensioned to receive up to six cables with diameters of 15 mm.

Embodiments of a secure-able cable access may be dimensioned and configured for single handed operation. For example, tension spring 350 may be sized such that bringing handles 360 and 362 together or moving hatch 220 require less than 2 lbf. In an embodiment, the components of secure-able cable access 200 may be sized such that forcing hatch 220 open from the outside requires a force as large as 60 lbf.

A further feature of an embodiment that employs metal, and particularly employs metal as the material for hatch 220 and bottom tray 208, is that the secure-able cable access acts as a shield against any electromagnetic radiation. Additionally, since embodiments of the secure-able cable access reduce the open access gaps through which air may flow, the air sealing performance of embodiments is greatly improved over that of typical off-the-shelf solutions (e.g., brush panels).

Returning to FIG. 3, secure-able cable access 200 employs the cooperation between linear ratchet 330 and pawl 320 to allow hatch 220 to move from a retracted position (to the right of the figure) to an extended position (to the left of the figure). Hatch 220 includes hatch handle 362 by which a user may, from within the enclosure, extend hatch 220. In the retracted position, hatch 220 does not overlap wide section 210 or slot 212 and cable connectors may be brought into the interior of the enclosure through opening 134 and wide section 210. As hatch 220 is extended it gradually overlaps more of wide section 210 and opening 134 until wide section 210 is completely obscured, at which point hatch 220 begins to overlap slot 212. At this point, any cables that had been fed through wide section 210 are forced into slot 212. Hatch 220 may then be further extended until it compresses any cables in slot 212 to the point that the user chooses not to force further compression. With hatch 220 extended as desired, the engagement of pawl hook 322 with teeth of ratchet 330 strongly resists movement of hatch 220 toward the retracted position. Cables retained within slot 212 may be protected from wear from the edge of slot 212 by a grommet 352.

As shown in FIG. 3, secure-able cable access 200 includes a bottom tray 206 secured to the bottom of rack top 136 using, e.g., threaded screws through flanges 354. Hatch 200 slides within a tray recess 356 that creates a space between bottom tray 206 and rack top 136. Ratchet 330 is affixed to bottom tray 206 using, e.g., threaded screws. Pawl 320 is secured at one end to hatch 220. Pawl 320 at the other end has a pawl hook 322. Pawl hook 322 and the teeth of ratchet 330 are oriented such that pawl hook 322 slides over the teeth of ratchet 330 as hatch 220 is extended. Conversely, pawl hook 322 engages one or more teeth of ratchet 330 when hatch 220 is moved slightly toward the retracted position. Once engaged, pawl hook 322 resists movement of hatch 220 toward the retracted position.

In the embodiment, so that hatch 220 may be retracted, secure-able cable access 200 is equipped with a ratchet release mechanism. The release mechanism includes a slider 310 attached to hatch 220 in a manner that allows slider 310 to move a limited distance relative to hatch 220. This movement is independent from any movement of hatch 220. Slider 310 is equipped with a slider handle 360 to allow a user to move slider 310. Slider 310 may move from a first position (relative to hatch 220) that allows pawl hook 322 to engage ratchet 330 to a second position (relative to hatch 220) that causes pawl hook 322 to lift, preventing it from engaging ratchet 330. With slider 310 in this second position and pawl hook 322 disengaged from ratchet 330, hatch 220 may be retracted. The lifting of pawl hook 322 is caused by relative movement between pawl 320 and slider 310, which will be discussed in more detail with regard to FIGS. 7-9B.

As shown in FIG. 3, slider 310 is positioned between hatch 220 and bottom tray 206. A hook access opening 312 is provided in slider 310 to allow pawl hook 322 to pass through and engage ratchet 330. Pawl hook 322, when lifted by slider 310 to disengage ratchet 330, passes through a pawl retraction opening 358 provided in hatch 220. To guard against the undesired retraction of hatch 220, it is preferable that pawl hook 322 and ratchet 330 remain engaged. For this reason, the position of slider 310 is biased by tension spring 350 toward the first, pawl-engaged position. To accomplish this biasing, movement of slider 310 from the first, pawl-engaged position to the second pawl-disengaged position is resisted by tension spring 350, which is connected to hatch 220 at spring anchor point 364 connected to slider 310 at spring anchor point 366. Tension in tension spring 350 works to bring anchor points 364, 366 together, which biases slider 310 to the right in the first, engaged position.

Figure 4:
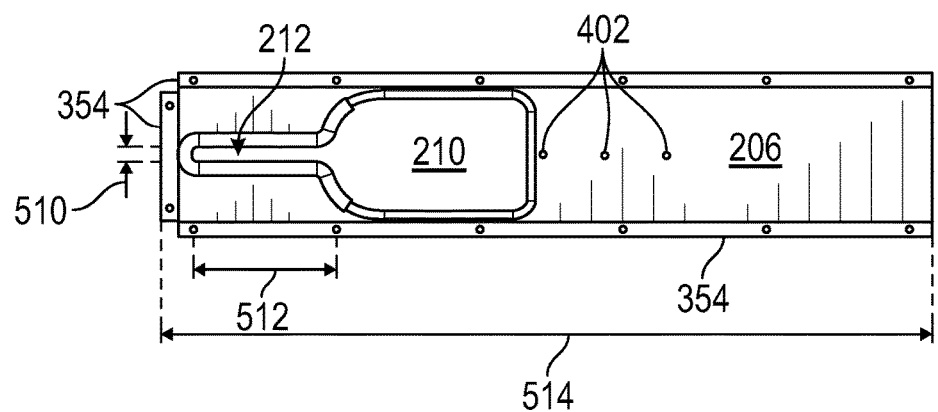
FIG. 4 is a top view of a part from the embodiment of FIG. 3.
Figure 5:
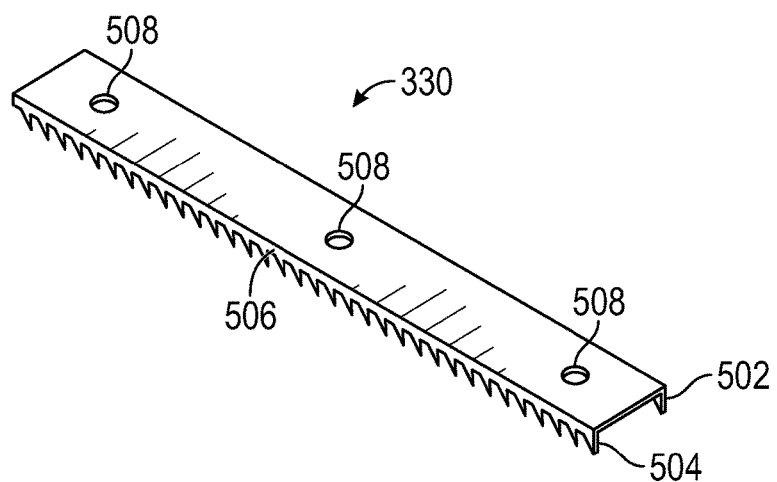
FIG. 5 is a perspective view of the bottom of a part from the embodiment of FIG. 3.

FIG. 4 is a top view of bottom tray 206 of FIGS. 2 and 3. FIG. 5 is a perspective view of the bottom of ratchet 330, which attaches to bottom tray 206. FIG. 4 shows the relative dimensions of an embodiment of wide section 210 and slot 212 of opening 208. Grommet 352 is also shown to extend beyond slot 212 and along part of the perimeter of wide section 210. Grommet 352 protects cables as hatch 220 extends and forces cables against perimeter edges of opening 208. Bottom tray 206 is further provided with attachment holes 402, which indicate where the flat back of ratchet 330 is attached to bottom tray 206 through corresponding ratchet attachment holes 508. With ratchet 330 attached to bottom tray 206, teeth 506 (only one tooth is labeled to prevent clutter) of teeth rows 502, 504 are angled toward opening 208 and, thus, are configured to cooperate with pawl hook 322 to resist movement of slider 310 away from opening 208. In an embodiment, width 510 of slot 212 may be 15.6 mm and length 512 of slot 212 may be 96 mm, which would accommodate, e.g., six cables with diameters of 15 mm. In an embodiment, length 514 of bottom tray 206 may be 537 mm, and the pitch of teeth 506 may be 3 mm.

Figure 6:
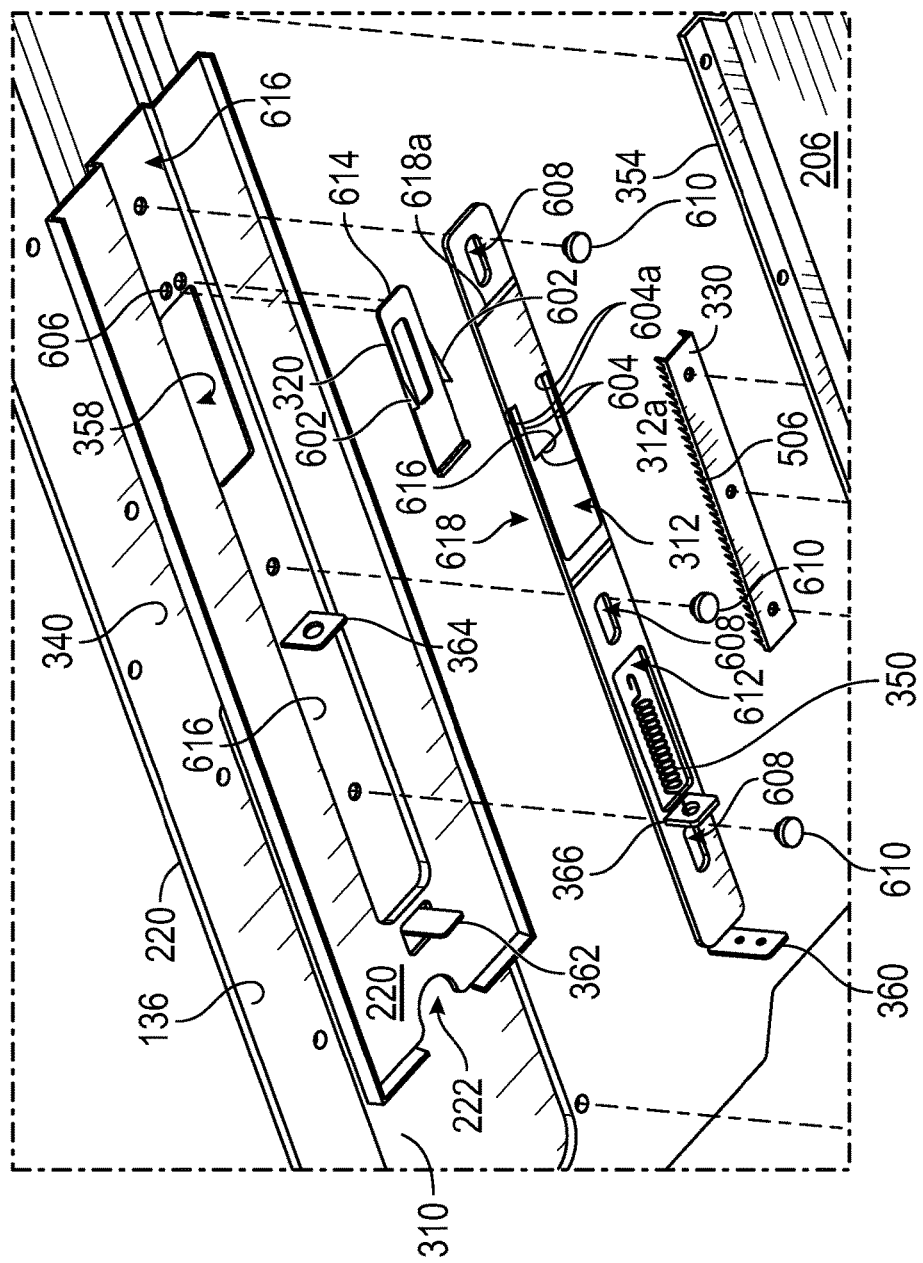
FIG. 6 an expanded view of a section of FIG. 3.

FIG. 6 an expanded view of a section of FIG. 3 to show aspects of the embodiment in more detail. In FIG. 6, notch 222 is shown at the end of hatch 220. Hatch 22 extends to overlap opening 134 from below, and to overlap opening 208 from above. Notch 222 cooperates with slot 212 to retain cables within slot 212 when hatch 220 is extended. Notch 222 may be fitted with a grommet as well (not shown). Hatch 220 is further provided with a slider recess 616 within which slider 310 moves between the engaged and disengaged positions. Slider 310 is provided with a pawl tray 618 to allow for pawl 320 to be positioned between hatch 220 and slider 310.

FIG. 6 shows the positions of spring anchor point 364 and of pawl retraction opening 358 on hatch 220. Pawl 320 is attached to hatch 220 at pawl connection holes 614 and 606 (on hatch 220). Slider 310 is attached to hatch 220 with slider pins 610 through slider slots 608. Slider pins 610 and slider slots 608 are dimensioned to allow slider 310 to be moved within slider recess 616 from a first position that allows the engagement of pawl hook 322 with ratchet 330, to a second position that forces pawl hook 322 to disengage from ratchet 330. The movement of slider 310 from the first to the second position may be accomplished by using slider handle 360 to move slider 310 toward hatch handle 362.

With slider 310 in the first position, pawl hook 322 engages ratchet 330 through hook access opening 312 and pawl ramps 602 extend into ramp access slots 604 within slider 310. When slider 310 moves to the second position, pawl ramps 602 are forced upward by the movement of ramp access slot end 604a. The upward movement of pawl ramps 602 also forces pawl hook 322 to retract into pawl retraction opening 358.

Movement of slider 310 from the first position to the second position is resisted by tension spring 350, which is located in spring slot 612 of slider 310. Details of the movement from the first position to the second position will be discussed further with respect to FIGS. 8 and 9.

Figure 7A:
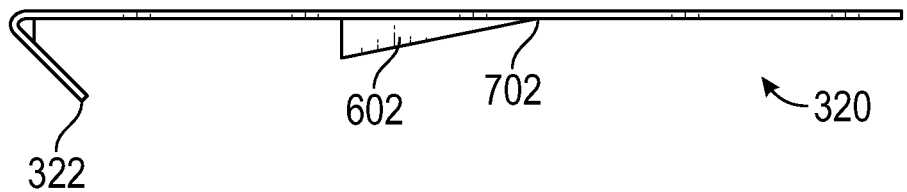
FIG. 7A is a side view of a part from the embodiment of FIG. 3.
Figure 7B:
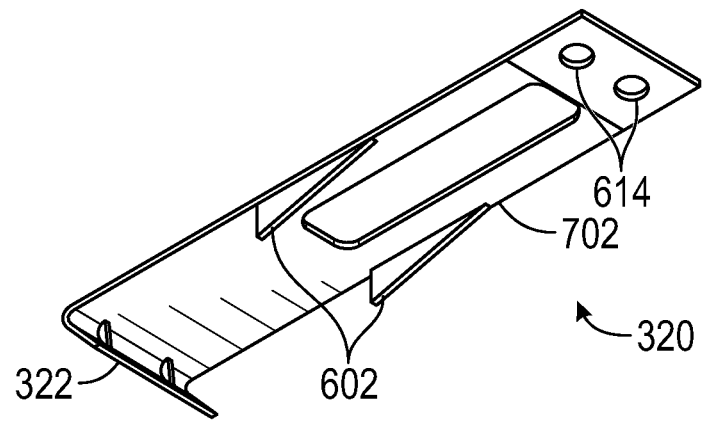
FIG. 7B is a bottom perspective view of the part from FIG. 7A.

FIG. 7A is a side view of pawl 320 showing pawl ramp 602 and pawl hook 322 more clearly. A pawl ramp edge 702 indicates the initial point at which slider 310 contacts pawl ramp 602 when slider 310 is moved from the first, engaged position to the second, disengaged position. FIG. 7B is a bottom perspective view of pawl 320 showing pawl ramps 602, pawl connection holes 614, and one of two pawl ramp edges 702.

FIG. 8A is a top perspective of a partial assembly of hatch 220 with slider 310 and ratchet 330 (but does not include the remainder of bottom tray 206). In FIG. 8A, hatch 220 is partially transparent so that aspects of slider 310, which is below slider 310 in this figure, can be seen in more detail. In FIG. 8A, slider 310 is in the first, engaged position relative to hatch 220. This can be seen by slider handle 360 being distanced from hatch handle 362, with a section of slider recess 616 between. Similarly, a rear edge 618a of pawl recess 618 is equally distant from the end of pawl 320. Also, the relative positions of slider pins 610 within slider slots 608 indicate that slider 310 is in the first, engaged position.

FIG. 8B is a side view of the partial assembly of FIG. 8A. As above, in FIG. 8B, hatch 220 is partially transparent so that aspects of slider 310, which is below slider 310 in this figure, can be seen in more detail. FIG. 8B illustrates further aspects of slider 310 being in the first, engaged position. In particular, pawl ramp 602 is shown extending through slider 310, indicating that pawl ramp 602 is received within pawl ramp access slot 604. This is confirmed by pawl ramp edge 702 being to the left of ramp access slot end 604a. In this first, engaged position, pawl hook 322 engages one of teeth 506. In this first, engaged position, pawl 320 resists movement of hatch 220 to the right with respect to ratchet 330 (and bottom tray 206), i.e., pawl 320 resists the retraction of hatch 220. But hatch 220 may still be moved to the left.

Figure 9A:
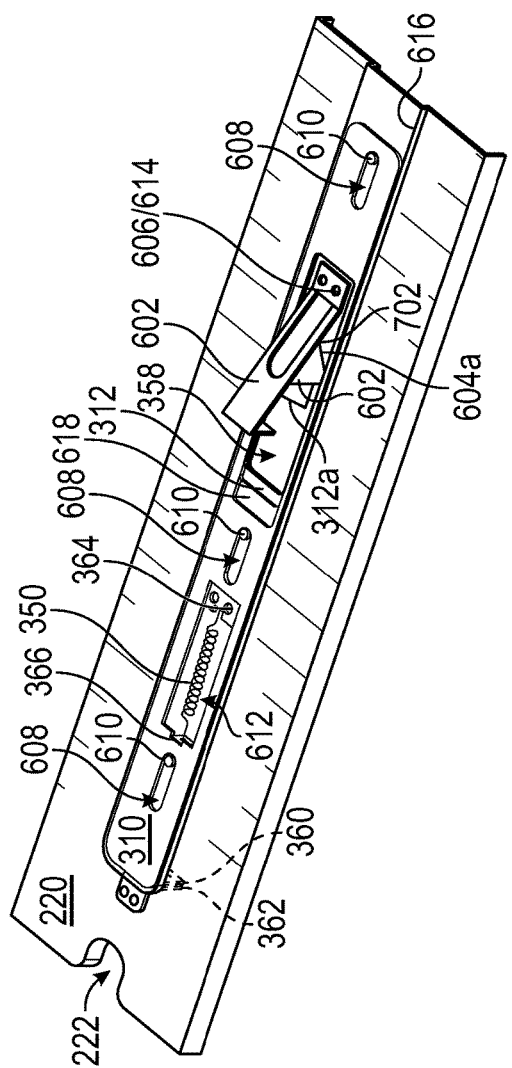
FIG. 9A is a top perspective of a partial assembly of the embodiment of FIG. 3 in a "ratchet-disengaged" state.

FIG. 9A is a top perspective of a partial assembly of hatch 220 with slider 310. In FIG. 9A, hatch 220 is partially transparent so that aspects of slider 310, which is below slider 310 in this figure, can be seen in more detail. In FIG. 9A, slider 310 is in the second, disengaged position relative to hatch 220. This can be seen by slider handle 360 being close to hatch handle 362, without any open section of slider recess 616 between. And rear edge 618a of pawl recess 618 is equally close to the end of pawl 320. Also, the relative positions of slider pins 610 within slots 608 indicate that slider 310 is in the second, disengaged position.

Figure 9B:
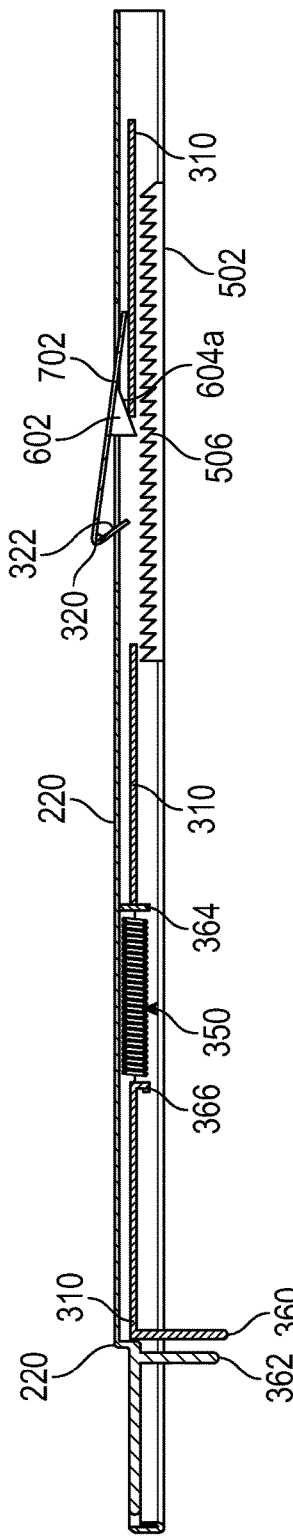
FIG. 9B is a side view of the partial assembly of FIG. 9A.

FIG. 9B is a side view of the partial assembly of FIG. 9A. As above, in FIG. 9B, hatch 220 is partially transparent so that aspects of slider 310, which is below slider 310 in this figure, can be seen in more detail. FIG. 9B illustrates further aspects of slider 310 being in the second, disengaged position. In particular, pawl ramp 602 is shown to be at least partially above slider 310, indicating that pawl ramp 602 is resting on some part of slider 310, and no longer completely within slot 604. This is confirmed by pawl ramp edge 702 being to the right of ramp access slot end 604a. In other words, slot end 604a has moved left and pushed under pawl ramp 602, causing it to rise. In this second, disengaged position, pawl hook 322 is raised and cannot engage any of teeth 506. In this second, disengaged position, pawl 320 no longer resists movement of hatch 220 to the right with respect to ratchet 330 (and bottom tray 206) and hatch 220 may be retracted so that it no longer overlaps openings 134 or 208.

In embodiments, the relative layering of rack top 136, hatch 220, slider 310, and tray 206 may be changed. For example, tray 206 may be attached to the exterior of rack top 136 with hatch 220 sandwiched between the two, and with slider 310 then sandwiched between hatch 220 and rack top 136. In this orientation, hatch 220 would extend to overlap opening 208 from below and overlap opening 134 from above.

In an embodiment, all or a subset of the elements of an embodiment of a secure-able cable access may be supplied as a kit, which may then be assembled into a secure-able cable access on an enclosure, such a server rack.

It is understood that any specific order or hierarchy of steps in any process disclosed is an illustration of an approach. Based upon design preferences, it is understood that the specific order or hierarchy of steps in the processes may be rearranged, or that all illustrated steps be performed. Some of the steps may be performed simultaneously.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
   a plate including a substantially rectangular first opening;
   a tray including a second opening having a large area and a slot area overlapped by the first opening, the large area being dimensioned to allow passage of a cable connector and the slot being dimensioned to allow passage of a cable but not a cable connector, the tray being immovably connected to the plate with the first opening overlapping the second opening;
   a hatch element positioned in a space between the plate and the tray, the hatch element movable within the space between a first position and a second position such that movement from the first position to the second position causes the hatch element to overlap a greater portion of the first and second openings; and
   a ratchet attached to the tray; and
   a pawl attached to the hatch element, wherein the ratchet and pawl are configured and positioned such that the ratchet and pawl interact to allow movement of the hatch element toward the second position and resist movement of the hatch element toward the first position.

2. The apparatus of claim 1, wherein the pawl includes a ramp oriented toward the ratchet, the apparatus further comprising:
   a release element attached to the hatch element between the hatch element and the tray, the release element slide-able from a third position to a fourth position with respect to the hatch element and including a ramp contact edge, movement of the release element from the third position to the fourth position causing the ramp contact edge to contact the ramp and urge the ramp away from the ratchet such that pawl is disengaged from the ratchet with the release element in the fourth position.

3. The apparatus of claim 2 further including a spring attached between the hatch element and the release element, the spring resisting movement of the release element from the third position toward the fourth position.

4. The apparatus of claim 1, wherein the release element includes a first tab accessible by a user through the large area of the second opening, and wherein the release element may be moved from the third position to the fourth position by movement of the first tab.

5. The apparatus of claim 4, wherein the hatch element includes a second tab accessible by the user through the large area of the second opening, and wherein the release element may be moved from the third position to the fourth position moving the first tab toward the second tab.

6. The apparatus of claim 1, wherein the hatch element includes a notch positioned to overlap the slot when the hatch element is in the second position.

7. An apparatus comprising:
   a plate including a substantially rectangular first opening;
   a tray including a second opening having a large area and a slot area overlapped by the first opening, the large area being dimensioned to allow passage of a cable connector and the slot being dimensioned to allow passage of a cable but not a cable connector, the tray being immovably connected to the plate with the first opening overlapping the second opening;
   a hatch element positioned in a space between the plate and the tray, the hatch element movable within the space between a first position and a second position such that movement from the first position to the second position causes the hatch element to overlap a greater portion of the first and second openings; and
   a ratchet and a pawl attached between the hatch element and the tray, the ratchet and pawl being configured and positioned such that the ratchet and pawl interact to allow movement of the hatch element toward the second position and resist movement of the hatch element toward the first position.

8. The apparatus of claim 7, wherein the pawl includes a ramp oriented toward the ratchet, the apparatus further comprising:
   a release element attached to the hatch element between the hatch element and the tray, the release element slide-able from a third position to a fourth position with respect to the hatch element and including a ramp contact edge, movement of the release element from the third position to the fourth position causing the ramp contact edge to contact the ramp and urge the ramp away from the ratchet such that pawl is disengaged from the ratchet with the release element in the fourth position.

9. The apparatus of claim 8 further including a spring attached between the hatch element and the release element, the spring resisting movement of the release element from the third position toward the fourth position.

10. The apparatus of claim 7, wherein the release element includes a first tab accessible by a user through the large area of the second opening, and wherein the release element may be moved from the third position to the fourth position by movement of the first tab.

11. The apparatus of claim 10, wherein the hatch element includes a second tab accessible by the user through the large area of the second opening, and wherein the release element may be moved from the third position to the fourth position moving the first tab toward the second tab.

12. The apparatus of claim 7, wherein the hatch element includes a notch positioned to overlap the slot when the hatch element is in the second position.

13. An apparatus comprising:
a plate including a substantially rectangular first opening;
a tray including a second opening having a large area and a slot area overlapped by the first opening, the large area being dimensioned to allow passage of a cable connector and the slot being dimensioned to allow passage of a cable but not a cable connector, the tray being immovably connected to the plate with the first opening overlapping the second opening;
a hatch element positioned in a space between the plate and the tray, the hatch element movable within the space between a first position and a second position such that movement from the first position to the second position causes the hatch element to overlap a greater portion of the first and second openings; and
means for allowing movement of the hatch element toward the second position and resisting movement of the hatch element toward the first position.

14. The apparatus of claim 13 further comprising:
means for allowing movement of the hatch element toward the first position.

15. The apparatus of claim 13, wherein the hatch element includes a notch positioned to overlap the slot when the hatch element is in the second position.

16. A kit for attaching to a rack with a plate including a substantially rectangular first opening, the kit comprising:
a tray including a second opening having a large area and a slot area overlapped by the first opening, the large area being dimensioned to allow passage of a cable connector and the slot being dimensioned to allow passage of a cable but not a cable connector, the tray being dimensioned and configured to be immovably connected to the plate with the first opening overlapping the second opening;
a hatch element configured and dimension to be positioned in a space between the plate and the tray, and to be movable within the space between a first position and a second position such that movement from the first position to the second position causes the hatch element to overlap a greater portion of the first and second openings;
a ratchet attached to the tray; and
a pawl attached to the hatch element, wherein the ratchet and pawl are configured and positioned such that the ratchet and pawl interact to allow movement of the hatch element toward the second position and resist movement of the hatch element toward the first position.

17. The apparatus of claim 16, wherein the pawl includes a ramp oriented toward the ratchet, the apparatus further comprising:
a release element attached to the hatch element between the hatch element and the tray, the release element slide-able from a third position to a fourth position with respect to the hatch element and including a ramp contact edge, movement of the release element from the third position to the fourth position causing the ramp contact edge to contact the ramp and urge the ramp away from the ratchet such that pawl is disengaged from the ratchet with the release element in the fourth position.

18. The apparatus of claim 17 further including a spring attached between the hatch element and the release element, the spring resisting movement of the release element from the third position toward the fourth position.

19. The apparatus of claim 16, wherein the release element includes a first tab accessible by a user through the large area of the second opening, and wherein the release element may be moved from the third position to the fourth position by movement of the first tab.

20. The apparatus of claim 19, wherein the hatch element includes a second tab accessible by the user through the large area of the second opening, and wherein the release element may be moved from the third position to the fourth position moving the first tab toward the second tab.

21. The apparatus of claim 16, wherein the hatch element includes a notch positioned to overlap the slot when the hatch element is in the second position.

* * * * *